United States Patent
Brody

(10) Patent No.: US 7,645,708 B2
(45) Date of Patent: Jan. 12, 2010

(54) SHADOW MASK DEPOSITION OF MATERIALS USING RECONFIGURABLE SHADOW MASKS

(75) Inventor: Thomas P. Brody, Pittsburgh, PA (US)

(73) Assignee: Advantech Global, Ltd, Tortola (VG)

( * ) Notice: Subject to any disclaimer, the term of this patent is extended or adjusted under 35 U.S.C. 154(b) by 240 days.

(21) Appl. No.: 11/820,406

(22) Filed: Jun. 19, 2007

(65) Prior Publication Data

US 2007/0243719 A1 Oct. 18, 2007

Related U.S. Application Data

(62) Division of application No. 11/147,508, filed on Jun. 8, 2005, now Pat. No. 7,271,111.

(51) Int. Cl.
*H01L 21/31* (2006.01)
*H01L 21/469* (2006.01)

(52) U.S. Cl. ............ 438/763; 438/944; 257/E21.294

(58) Field of Classification Search ............ 438/763, 438/944

See application file for complete search history.

(56) References Cited

U.S. PATENT DOCUMENTS

| | | | |
|---|---|---|---|
| 3,657,613 A | 4/1972 | Brody et al. | |
| 4,450,786 A | 5/1984 | Doehler et al. | |
| 4,592,306 A | 6/1986 | Gallego | |
| 4,615,781 A | 10/1986 | Boudreau | |
| 5,250,467 A | 10/1993 | Somekh et al. | |
| 5,330,628 A | 7/1994 | Demaray et al. | |
| 5,405,652 A | 4/1995 | Kashiwagi et al. | |
| 5,643,428 A | 7/1997 | Krivokapic et al. | |
| 6,281,552 B1 | 8/2001 | Kawasaki et al. | |
| 6,384,529 B2 | 5/2002 | Tang et al. | |
| 6,489,176 B2 | 12/2002 | Ninomiya | |
| 6,582,504 B1 | 6/2003 | Fujita | |
| 6,677,174 B2 | 1/2004 | Kim et al. | |
| 6,791,258 B2 | 9/2004 | Haase et al. | |
| 6,943,066 B2 | 9/2005 | Brody et al. | |
| 7,132,016 B2 | 11/2006 | Brody et al. | |
| 7,132,361 B2 | 11/2006 | Brody et al. | |
| 2002/0009538 A1 | 1/2002 | Arai | |
| 2002/0179013 A1 | 12/2002 | Kido et al. | |
| 2003/0228715 A1 | 12/2003 | Brody et al. | |

OTHER PUBLICATIONS

Brody, T. Peter, "The birth and early childhood of active matrix—A personal memoir", Journal of the SID, 4/3, 1996, pp. 113-127.

*Primary Examiner*—David A Zarneke
(74) *Attorney, Agent, or Firm*—The Webb Law Firm

(57) ABSTRACT

A shadow mask deposition system includes a plurality of identical shadow masks arranged in a number of stacks to form a like number of compound shadow masks, each of which is disposed in a deposition vacuum vessel along with a material deposition source. Materials from the material deposition sources are deposited on the substrate via openings in corresponding compound shadow masks, each opening being formed by the whole or partial alignment of apertures in the shadow masks forming the compound shadow mask, to form an array of electronic elements on the substrate.

6 Claims, 14 Drawing Sheets

SHADOW MASK DEPOSITION OF MATERIALS USING RECONFIGURABLE SHADOW MASKS

CROSS REFERENCE TO RELATED APPLICATIONS

This application is a divisional application of co-pending U.S. patent application Ser. No. 11/147,508, filed Jun. 8, 2005, which is incorporated herein by reference.

BACKGROUND OF THE INVENTION

1. Field of the Invention

The present invention relates to a method of forming an electronic device on a substrate and, more particularly, to a method of forming one or more electronic elements of the electronic device on the substrate by way of a shadow mask deposition process.

2. Description of Related Art

Electronic circuits with repetitive patterns, such as memories and imaging or display devices are, widely used in LED industry. Presently, such circuits are formed by photolithographic processes.

A shadow mask deposition process is well-known and has been used for years in micro-electronics manufacturing. The shadow mask process is a significantly less costly and less complex manufacturing process compared to the photolithography process. Accordingly, it would be desirable to utilize the shadow mask deposition process to form electronic circuits.

One problem with the current shadow mask deposition process is the need to engineer, manufacture and inventory a large number of shadow masks, each of which typically has one or more apertures of a unique size and/or location in the shadow mask. Thus, for example, if a plurality of shadow mask deposition events is required to produce the electronic elements of an electronic circuit having a repetitive pattern, a plurality of different shadow masks is typically required, since each deposition event will typically entail the deposition of material of a unique size and/or a unique location on the substrate.

It would, therefore, be desirable, to overcome the above problem and others by providing shadow masks that have configurable opening sizes whereupon the need to engineer, manufacture and inventory a unique shadow mask for each deposition event is avoided.

SUMMARY OF THE INVENTION

The invention is a shadow mask deposition method that includes (a) advancing a substrate through a plurality of deposition vacuum vessels, each of which includes a material deposition source and a compound shadow mask positioned therein; and (b) depositing on the substrate the material from the material deposition source positioned in each deposition vacuum vessel via the corresponding compound shadow mask to form on the substrate a circuit comprised of an array of electronic elements. Each compound shadow mask includes a first shadow mask having at least one first aperture therethrough and a second shadow mask having at least one second aperture therethrough. The first and second shadow masks of each compound shadow mask are positioned with the one first aperture aligned with the one second aperture in a manner to define a desired sized opening through the compound shadow mask for the deposition of material in a desired pattern on the substrate therethrough. Desirably, the circuit is formed solely by the successive deposition of materials on the substrate.

Each first shadow mask can have a plurality of first apertures therethrough, with all of said first apertures having the same dimensions. Each second shadow mask can have a plurality of second apertures therethrough, with all of said second apertures having the same dimensions.

All of the first shadow masks can have the same pattern of first apertures therethrough. All of the second shadow masks can have the same pattern of second apertures therethrough.

Each first aperture can have the same dimensions as each second aperture. The pattern of first apertures in each first shadow mask can be the same as the pattern of second apertures in each second shadow mask.

The circuit can include a plurality of identical electronic elements, each of which has the same dimensions. Each first aperture and each second aperture can have dimensions that are greater than one-half of the dimensions of each electronic element but less than a value wherein one first aperture is in alignment with two second apertures, or vice versa, during the deposition of at least one material on the substrate.

Desirably, all of the shadow masks are identical.

A first deposition vacuum vessel can include a first compound shadow mask having its first and second shadow masks positioned such that the corresponding first and second apertures define an opening in the first compound shadow mask having first dimensions. A second deposition vacuum vessel includes a second compound shadow mask having its first and second shadow masks positioned such that the corresponding first and second apertures define an opening in the second compound shadow mask having second, different dimensions.

The plurality of deposition vacuum vessels can be interconnected. The substrate can be an elongated sheet that is advanced along its length through the plurality of deposition vacuum vessels whereupon at least one part of the substrate advances sequentially through each deposition vacuum vessel. The one part of the substrate can receive deposits of materials from the deposition sources positioned in the deposition vacuum vessels.

The invention is also a shadow mask deposition method of forming an electronic device. The method includes (a) providing a plurality of identical shadow masks arranged in a number of stacks to form a like number of compound shadow masks, each of which is disposed in a deposition vacuum vessel along with a material deposition source; (b) depositing a first material on a substrate from the material deposition source in a first deposition vacuum vessel via an opening in a first compound shadow mask formed by the whole or partial alignment of apertures of the stack of shadow masks forming said first compound shadow mask; and (c) depositing a second material on the substrate from the material deposition source in a second deposition vacuum vessel via an opening in a second compound shadow mask formed by the whole or partial alignment of apertures in the stack of the shadow masks forming said second compound shadow mask, wherein at least one of (i) dimensions of each compound shadow mask opening and (ii) a location of each compound shadow mask opening relative to the substrate during the deposition of material through said opening is different whereupon the dimensions and/or the location of each material deposited on the substrate is different.

The method can further include sequentially depositing a plurality of materials on the substrate via openings in a like plurality of compound shadow masks to form an array of electronic elements on the substrate, wherein each opening is formed by the whole or partial alignment of apertures in the shadow masks forming said compound shadow mask.

Each material can be one of a conductor, an insulator and a semiconductor.

The invention is also a shadow mask deposition system that includes a plurality of series connected deposition vacuum vessels; a material deposition source disposed in each deposition vacuum vessel; a compound shadow mask disposed in each deposition vacuum vessel, with each compound shadow mask comprised of a plurality of identical shadow masks arranged in a stack, and with each compound shadow mask having at least one opening therethrough defined by the whole or partial alignment of apertures in the identical shadow masks comprising said compound shadow mask; and means for translating a substrate through the series connected deposition vacuum vessels to receive a deposit of the material from each material deposition source via the at least one opening in the corresponding compound shadow mask to form at least one electronic element on said substrate with the material from each material deposition source.

At least one of (i) a size of each opening of each compound shadow mask and (ii) a location of each opening of each compound shadow mask relative to the substrate during deposition of the material through said opening can be different.

Each compound shadow mask can include a plurality of openings therethrough. The deposit of material from each material deposition source can form a plurality of electronic elements on the substrate.

The plurality of electronic elements can be formed on the substrate solely by the successive deposition of materials from the material deposition sources.

The substrate can be at least one of (i) electrically insulative, (ii) flexible and (iii) transparent.

Lastly, the invention is a method of forming an electronic device. The method includes (a) providing a substrate; (b) depositing semiconductor material on the substrate through a first compound shadow mask in the presence of a vacuum; (c) depositing conductive material on the substrate through a second compound shadow mask in the presence of a vacuum; and (d) depositing insulating material on the substrate through a third compound shadow mask in the presence of a vacuum. The actual deposition sequence is determined by the design of the electronic elements of the electronic device and is not arbitrary. Each compound shadow mask can be comprised of a plurality of identical shadow masks, each of which has an aperture therethrough. The shadow masks of each compound shadow mask are positioned with the apertures thereof aligned in a manner to define an opening through the compound shadow mask for the deposition of the corresponding material in a desired pattern on the substrate therethrough. The deposit of the insulating material, the semiconductor material and the conductive material co-act to form an electronic element on the substrate solely by the successive deposition of materials through the openings in the compound shadow masks.

The electronic element can be thin film transistor (TFT), a diode, a memory element, a capacitor, or any combination of the foregoing. The electronic device can also include interconnects formed from one or more deposits of conductive material(s).

Desirably, all of the compound shadow masks are the same and are configurable to facilitate the deposition of materials of desired dimensions and locations on the substrate.

DETAILED DESCRIPTION OF THE INVENTION

The present invention will be described with reference to the accompanying figures where like reference numbers correspond to like elements.

Figure 1A:
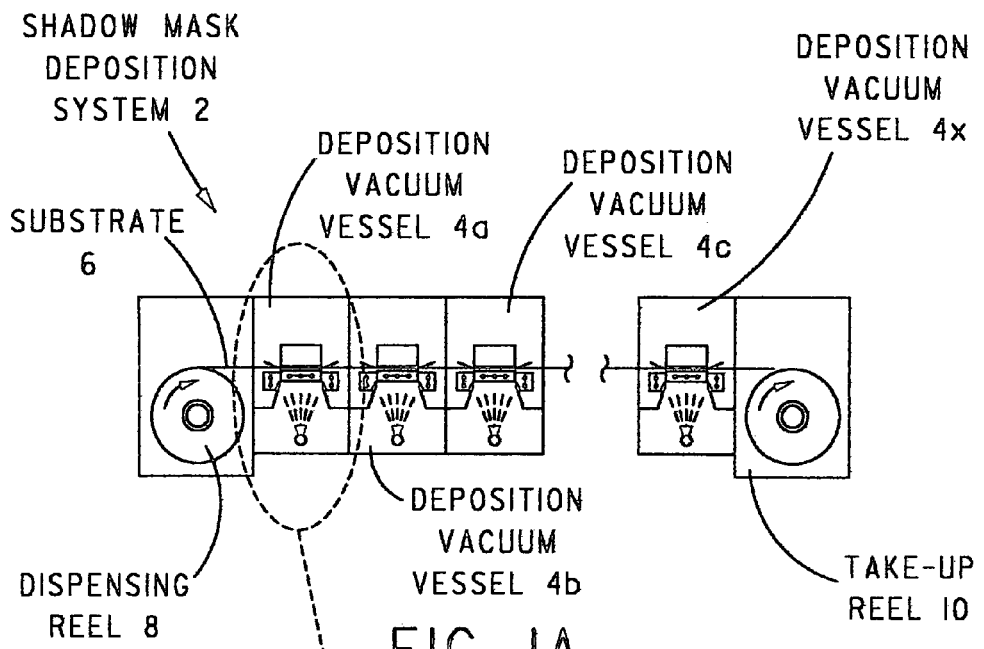
FIG. 1A is a diagrammatic illustration of a shadow mask deposition system for forming pixel structures of a high resolution active matrix backplane.
Figure 1B:
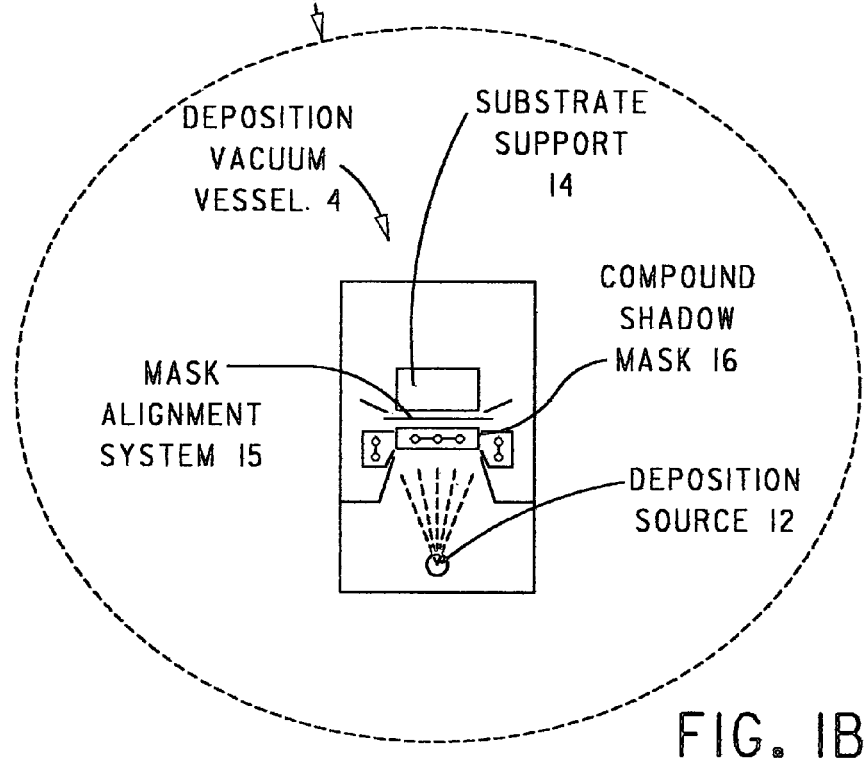
FIG. 1B is an enlarged view of a single deposition vacuum vessel of the shadow mask deposition system of FIG. 1A.

With reference to FIGS. 1A and 1B, a shadow mask deposition system 2 for forming an electronic device, such as, without limitation, a high resolution active matrix light emitting diode (LED) display, includes a plurality of serially arranged deposition vacuum vessels 4 (e.g., deposition vacuum vessels 4a-4x). The number and arrangement of deposition vacuum vessels 4 is dependent on the number of deposition events required for any given product to be formed therewith.

In use of shadow mask deposition system 2, a flexible substrate 6 translates through the serially arranged deposition vacuum vessels 4 by means of a reel-to-reel mechanism that includes a dispensing reel 8 and a take-up reel 10.

Each deposition vacuum vessel includes a deposition source 12, a substrate support 14, a mask alignment system 15 and a compound shadow mask 16. For example, deposition vacuum vessel 4a includes deposition source 12a, substrate support 14a, mask alignment system 15a and compound shadow mask 16a; deposition vacuum vessel 4b includes deposition source 12b, substrate support 14b, mask alignment system 15b and compound shadow mask 16b; and so forth for any number of deposition vacuum vessels 4.

Each deposition source 12 is charged with a desired material to be deposited onto substrate 6 through one or more openings in the corresponding compound shadow mask 16 which is held in intimate contact with the portion of substrate 6 in the corresponding deposition vacuum vessel 4 during a deposition event.

Each compound shadow mask 16 of shadow mask deposition system 2 includes one or more openings. The opening(s)

in each compound shadow mask 16 corresponds to a desired pattern of material to be deposited on substrate 6 from a corresponding deposition source 12 in a corresponding deposition vacuum vessel 4 as substrate 6 translates through shadow mask deposition system 2.

Each compound shadow mask 16 is formed of, for example, nickel, chromium, steel, copper, Kovar®or Invar®, and has a thickness desirably between 20 and 200 microns, and more desirably between 20 and 50 microns. Kovar®and Invar® can be obtained from, for example, ESPICorp Inc. of Ashland, Oreg. In the United States, Kovar®is a registered trademark, Registration No. 337,962, currently owned by CRS Holdings, Inc. of Wilmington, Del. and Invar® is a registered trademark, Registration No. 63,970, currently owned by Imphy S.A. Corporation of France.

Those skilled in the art will appreciate that shadow mask deposition system 2 may include additional stages (not shown), such as an anneal stage, a test stage, one or more cleaning stages, a cut and mount stage, and the like, as are well-known. In addition, the number, purpose and arrangement of deposition vacuum vessels 4 can be modified by one of ordinary skill in the art as needed for depositing one or more materials required for a particular application. An exemplary shadow mask deposition system and method of use thereof is disclosed in U.S. patent. application Ser. No. 10/255,972, filed Sep. 26, 2002, entitled "Active Matrix Backplane For Controlling Controlled Elements And Method Of Manufacture Thereof", which is incorporated herein by reference.

Deposition vacuum vessels 4 can be utilized for depositing materials on substrate 6 to form one or more electronic elements of the electronic device on substrate 6. Each electronic element may be, for example, a thin film transistor (TFT), a memory element, a capacitor etc., or, a combination of one or more of said elements to form a higher level electronic element, such as, without limitation, a sub-pixel or a pixel of the electronic device. In accordance with the present invention, a multi-layer circuit can be formed solely by successive depositions of materials on substrate 6 via successive deposition events in deposition vacuum vessels 4.

Each deposition vacuum vessel 4 is connected to a source of vacuum (not shown) which is operative for establishing a suitable vacuum therein in order to enable a charge of the material disposed in the corresponding deposition source 12 to be deposited on substrate 6 in a manner known in the art, e.g., sputtering or vapor phase deposition, through the one or more openings in the corresponding compound shadow mask 16.

Herein, substrate 6 is described as a continuous flexible sheet which is dispensed from dispensing reel 8, which is disposed in a pre-load vacuum vessel, into the deposition vacuum vessels 4. However, this is not to be construed as limiting the invention since shadow mask deposition system 2 can be configured to continuously process a plurality of standalone or individual substrates. Each deposition vacuum vessel 4 can include supports or guides that avoid the sagging of substrate 6 as it advances therethrough.

In operation of shadow mask deposition system 2, the material disposed in each deposition source 12 is deposited on the portion of substrate 6 in the corresponding deposition vacuum vessel 4 through one or more openings in the corresponding compound shadow mask 16 in the presence of a suitable vacuum as said portion of substrate 6 is advanced through the deposition vacuum vessel 4, whereupon plural, progressive patterns is formed on substrate 6. More specifically, substrate 6 has plural portions, each of which is positioned for a predetermined time interval in each deposition vacuum vessel 4. During this predetermined time interval, material is deposited from the corresponding deposition source 12 onto the portion of substrate 6 that is positioned in the corresponding deposition vacuum vessel 4. After this predetermined time interval, substrate 6 is step advanced so that the portion of substrate 6 is advanced to the next vacuum vessel in series for additional processing, as applicable. This step advancement continues until each portion of substrate 6 has passed through all deposition vacuum vessels 4. Thereafter, each portion of substrate 6 exiting the final deposition vacuum vessel 4 in the series is received on take-up reel 10, which is positioned in a storage vacuum vessel (not shown). Alternatively, each portion of substrate 6 exiting shadow mask deposition system 2 is separated from the remainder of substrate 6 by a cutter (not shown).

Figure 2:
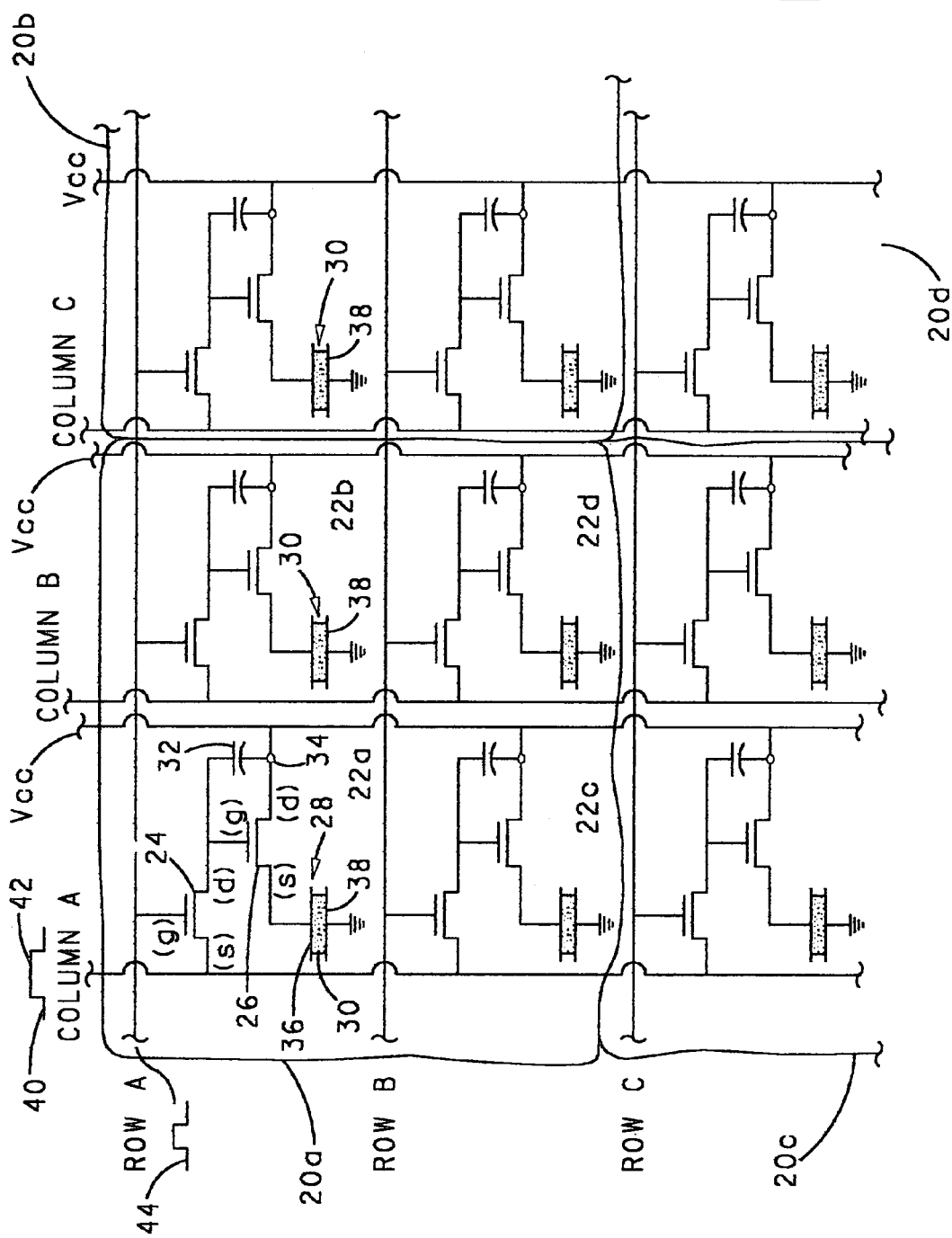
FIG. 2 is a circuit schematic of a 3×3 array of sub-pixels of an active matrix backplane wherein a 2×2 array of said 3×3 array define a pixel of said active matrix backplane.

With reference to FIG. 2, an exemplary LED pixel 20*a* that can be formed via shadow mask deposition system 2 comprises a 2×2 arrangement of sub-pixels 22, e.g., sub-pixels 22*a*-22*d*. Sub-pixels 22*a*, 22*b*, 22*c* and 22*d* can be a red sub-pixel, a first green sub-pixel, a second green sub-pixel and a blue sub-pixel, respectively. Alternatively, sub-pixels 22*a*, 22*b*, 22*c* and 22*d* can be a red sub-pixel, a first blue sub-pixel, a second blue sub-pixel and a green sub-pixel, respectively. Since LED pixel 20*a* is representative of one of several of identical pixels arranged in any user defined array configuration for forming a complete active matrix LED device, the description of LED pixel 20*a*, including the color of each sub-pixel 22, is not to be construed as limiting the invention. In FIG. 2, the sub-pixels of adjacent pixels 20*b*, 20*c* and 20*d* are shown for illustration purposes. Sub-pixels 22*a* and 22*b* are addressed via a pulse signal applied on a Row A bus and via voltage levels applied on a Column A bus and a Column B bus, respectively. Sub-pixels 22*c* and 22*d* are addressed via a pulse signal applied on a Row B bus and via voltage levels applied on the Column A and the Column B bus, respectively. In the illustrated embodiment, each sub-pixel 22 includes cascade connected transistors 24 and 26, such as, without limitation, thin film transistors (TFTs); an LED element 28 formed of light emitting material 30 sandwiched between two electrodes; and a capacitor 32 which serves as a voltage storage element. In an exemplary, non-limiting embodiment, transistors 24 and 26, LED element 28 and capacitor 32 of each sub-pixel 22 are interconnected to each other in a manner illustrated in FIG. 2. In addition, for each sub-pixel 22, a control or gate terminal of transistor 24 is electrically connected to a suitable row bus, a node 34 formed by the connection of the drain terminal of transistor 26 to one terminal of capacitor 32 is connected to a power bus (Vcc), and the source terminal of transistor 24 is connected to a suitable column bus.

To activate each LED element 28 when a suitable voltage is applied to the corresponding power bus Vcc, the voltage applied to the corresponding column bus connected to the source terminal of transistor 24 is changed from a first voltage 40 to a second voltage 42. During application of second voltage 42, a pulse signal 44 is applied to the row bus connected to the gate terminal of transistor 24. Pulse signal 44 causes transistors 24 and 26 to conduct, whereupon, subject to the voltage drop across transistor 26, the voltage of power bus Vcc is applied to one terminal of LED element 28. Since the other terminal of LED element 28 is connected to a different potential, e.g., ground potential, the application of the voltage applied to power bus Vcc to LED element 28 causes LED element 28 to illuminate. During application of pulse signal 44, capacitor 32 charges to the difference between second voltage 42 and the voltage on power bus Vcc, minus any voltage drop across transistor 24.

Upon termination of pulse signal 44, capacitor 32 retains the voltage stored thereon and impresses this voltage on the gate terminal of transistor 26, whereupon LED element 28 is held in an active, illuminating state in the absence of pulse signal 44.

LED element 28 is turned off when pulse signal 44 is applied in the presence of first voltage 40 on the corresponding column bus. More specifically, applying pulse signal 44 to the gate terminal of transistor 24 when first voltage 40 is applied to the source terminal of transistor 24 causes transistor 24 to turn on, whereupon capacitor 32 discharges through transistor 24 thereby turning off transistor 26 and deactivating LED element 28. Upon termination of pulse signal 44, capacitor 34 is charged to approximately voltage 40, whereupon transistor 26 is held in its off state and LED element 28 is held in its inactive state even after pulse signal 44 is terminated.

In a like manner, each LED element 28 of each sub-pixel 22 of each pixel 20 can be turned on and off in response to the application of a pulse signal 44 on an appropriate row bus when second voltage 42 and first voltage 40, respectively, are applied to the appropriate column bus in the presence of a suitable voltage applied via the appropriate power bus Vcc.

Figure 3:
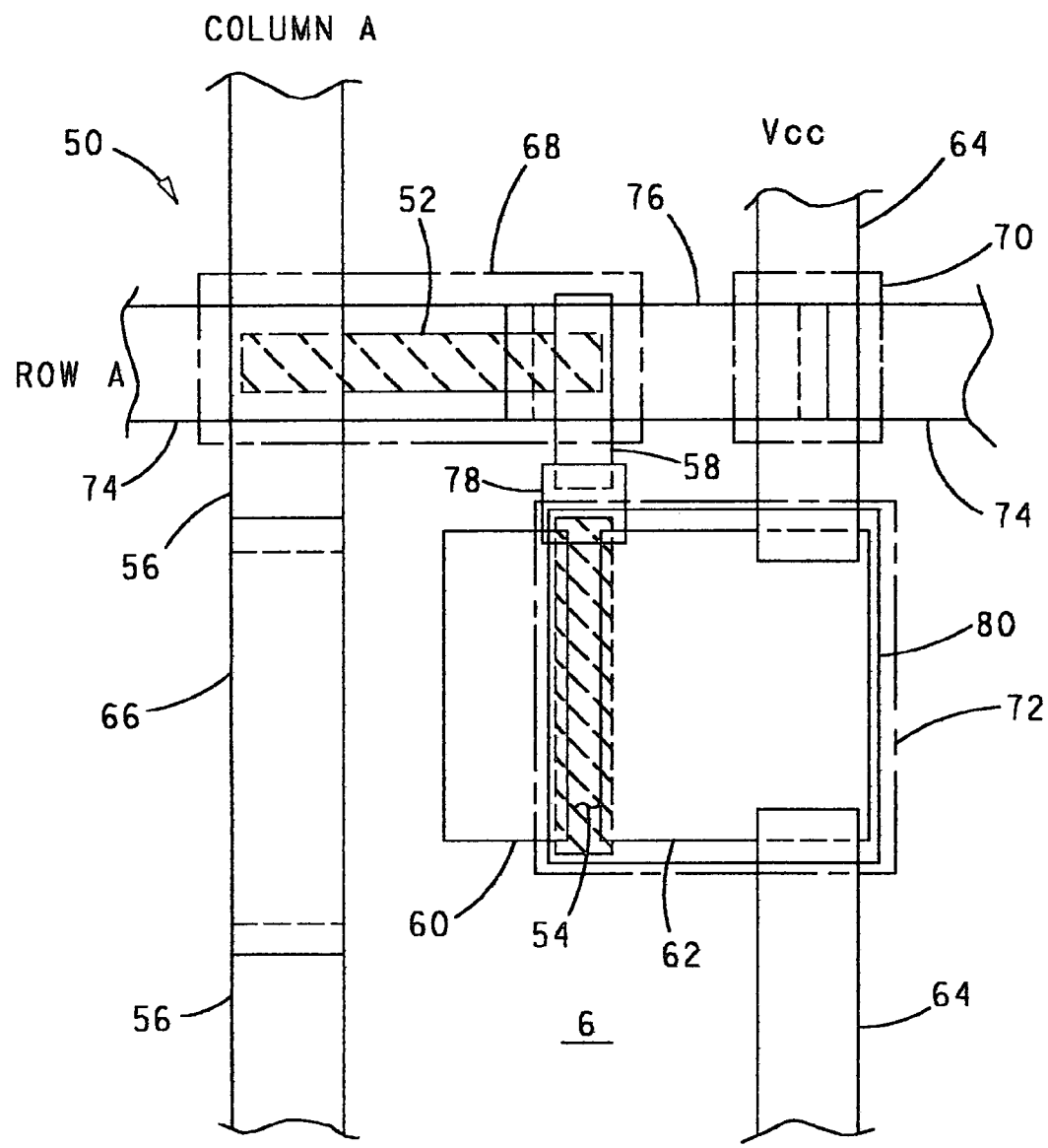
FIG. 3 is an enlarged view of an exemplary physical layout of one of the sub-pixels of FIG. 2.

With reference to FIG. 3 and with continuing reference to FIG. 2, a sub-pixel structure 50 representative of the physical structure that forms each sub-pixel 22 of each pixel 20 includes, in desired order of deposition, elongated semiconductor segment 52, elongated semiconductor segment 54, elongated metal segment(s) 56, elongated metal segment 58, elongated metal segment 60, rectangular metal segment 62, elongated metal segment(s) 64, elongated metal segment 66, elongated insulator segment 68, rectangular insulator segment 70, rectangular insulator segment 72, elongated metal segment(s) 74, elongated metal segment 76, rectangular metal segment 78 and rectangular metal segment 80.

Each metal segment 56-66 and 74-80 can be formed of any suitable electrically conductive material that is depositable via a shadow mask deposition process, such as, without limitation, molybdenum(Mo), copper (Cu), nickel (Ni), chromium (Cr), aluminum (Al), gold (Au) or indium-tin oxide (ITO). Insulator segments 68-72 can be formed of any suitable electrically nonconductive material that is depositable via a shadow mask deposition process, such as, without limitation, aluminum oxide ($Al_2O_3$) or silicon dioxide ($SiO_2$). Each semiconductor segment 52 and 54 can be formed of a semiconductor material that is depositable via a shadow mask deposition process and which is suitable for forming a thin-film transistor (TFT) by vacuum evaporation, such as, without limitation, cadmium selenide (CdSe), cadmium sulfide (CdS) or tellurium (Te).

In sub-pixel structure 50, the stack comprised of metal segment 62, insulator 72 and metal segment 80 forms capacitor 32; the combination of the segments forming capacitor 32 along with semiconductor segment 54 and metal segment 60 form transistor 26 (with metal segments 80, 60 and 62 being the respective gate, source and drain of transistor 26); and the combination of semiconductor segment 52, metal segments 56 and 58, insulator segment 68 and metal segments 74 and 76 forming transistor 24 (with metal segments 56 and 58 being the source and drain of transistor 24, and with metal segments 74 and 76 forming the gate of transistor 24).

Desirably, each sub-pixel 22 in FIG. 2 is realized by the same sub-pixel structure, such as sub-pixel structure 50. However, this is not to be construed as limiting the invention since each sub-pixel 22 can be realized by any suitable sub-pixel structure. For purpose of describing the present invention, however, it will be assumed hereinafter that each sub-pixel 22 is realized by sub-pixel structure 50.

In one exemplary, non-limiting, embodiment, substrate 6 is formed of an electrically insulative material, such as an insulative coated metal sheet; metal segments 60, 62 and 80 are formed from Mo, Cu, Ni, Cr, Au or Al ; insulator segments 68-72 are formed from $Al_2O_3$ or $SiO_2$; metal segments 56, 58, 64, 66 and 74-78 are formed from Mo, Cu, Ni, Cr, Au or Al and semiconductor segments 52 and 54 are formed from CdSe, CdS, Te or any other suitable semiconducting material that can be deposited via a shadow mask deposition process.

To complete formation of each functioning sub-pixel 22, a suitable insulating material (not shown) is deposited atop of the sub-pixel structure 50 shown in FIG. 3 with an opening exposing all or a portion of metal segment 60. Another metal segment 36 can then be deposited atop the thus deposited insulating material in contact with metal segment 60 via the opening in the insulating material. Thereafter, light emitting material 30 can be deposited atop the sub-pixel structure 50 in contact with metal segment 36 and a transparent metal segment 38 can be deposited atop light emitting material 30, whereupon light emitting material 30 is sandwiched between metal segment 36 and transparent metal segment 38. Desirably, each deposit of metal segment 36, light emitting material 30 and transparent metal segment 38 is deposited atop of their corresponding sub-pixel 22 in isolation from adjacent deposits of metal segment 36, light emitting material 30 and transparent metal segment 38 atop their corresponding sub-pixels 22. Lastly, a layer or sheet of transparent metal (not shown) can be deposited atop of all of the metal layers 38 and the insulating material therebetween as a common electrode for all of the sub-pixels.

Figure 4:
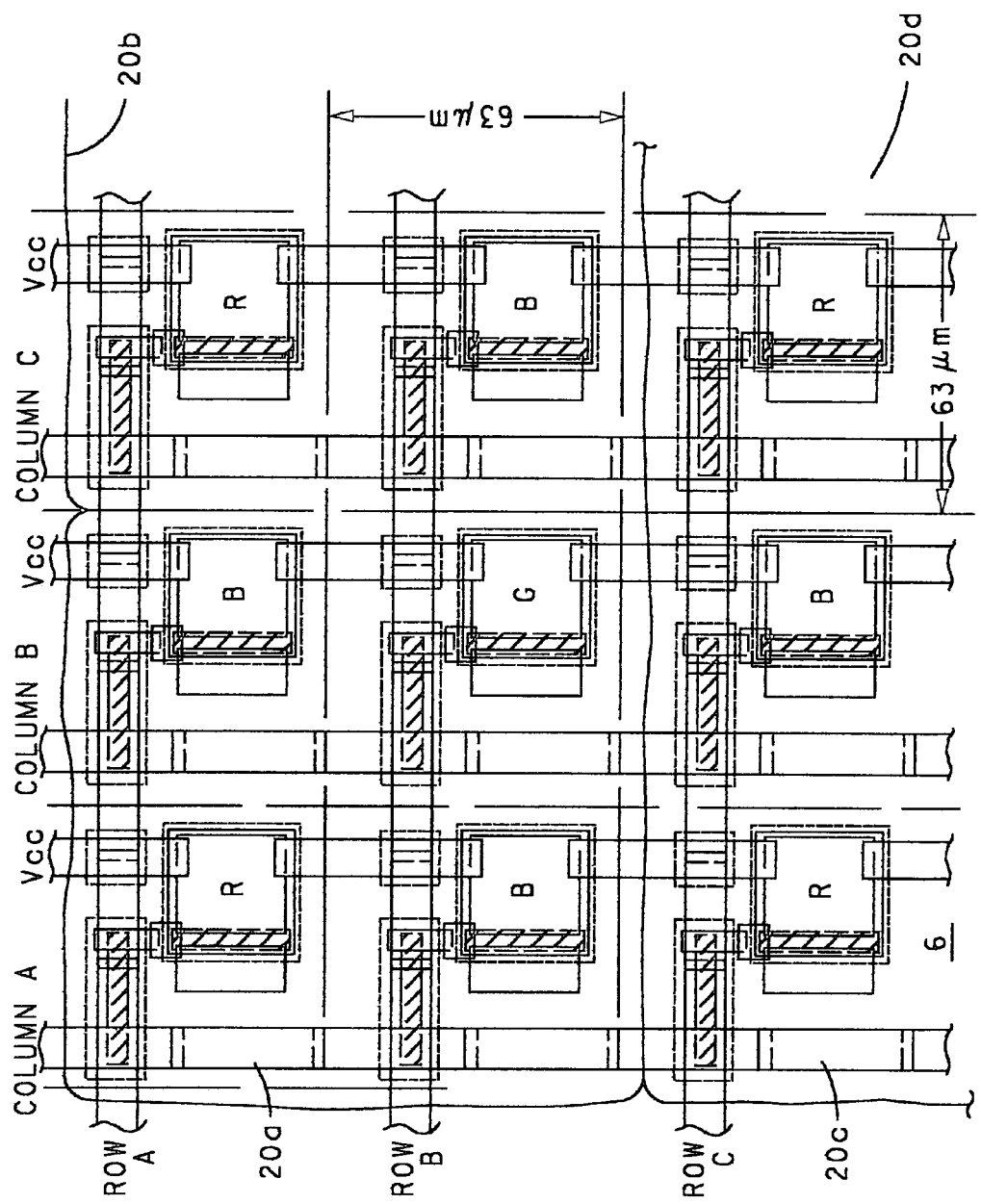
FIG. 4 is a view of an exemplary physical layout of the sub-pixel structures that form the sub-pixels of FIG. 2.

With reference to FIG. 4 and with continuing reference to FIGS. 1-3, a physical implementation of an LED pixel structure corresponding to the circuit schematic of FIG. 2 is shown upon substrate 6. In one exemplary embodiment, the overall dimensions of each pixel 20 is 126×126 microns and the overall dimensions of each sub-pixel 22 is 63×63 microns. The foregoing dimensions of each pixel 20 and each sub-pixel 22a, however, are exemplary only and are not to be construed as limiting the invention.

An exemplary, non-limiting sequence of depositions through openings in compound shadow masks 16 of shadow mask deposition system 2 to form the sub-pixel structure 50 comprising each sub-pixel 22 will now be described.

Figure 5A:
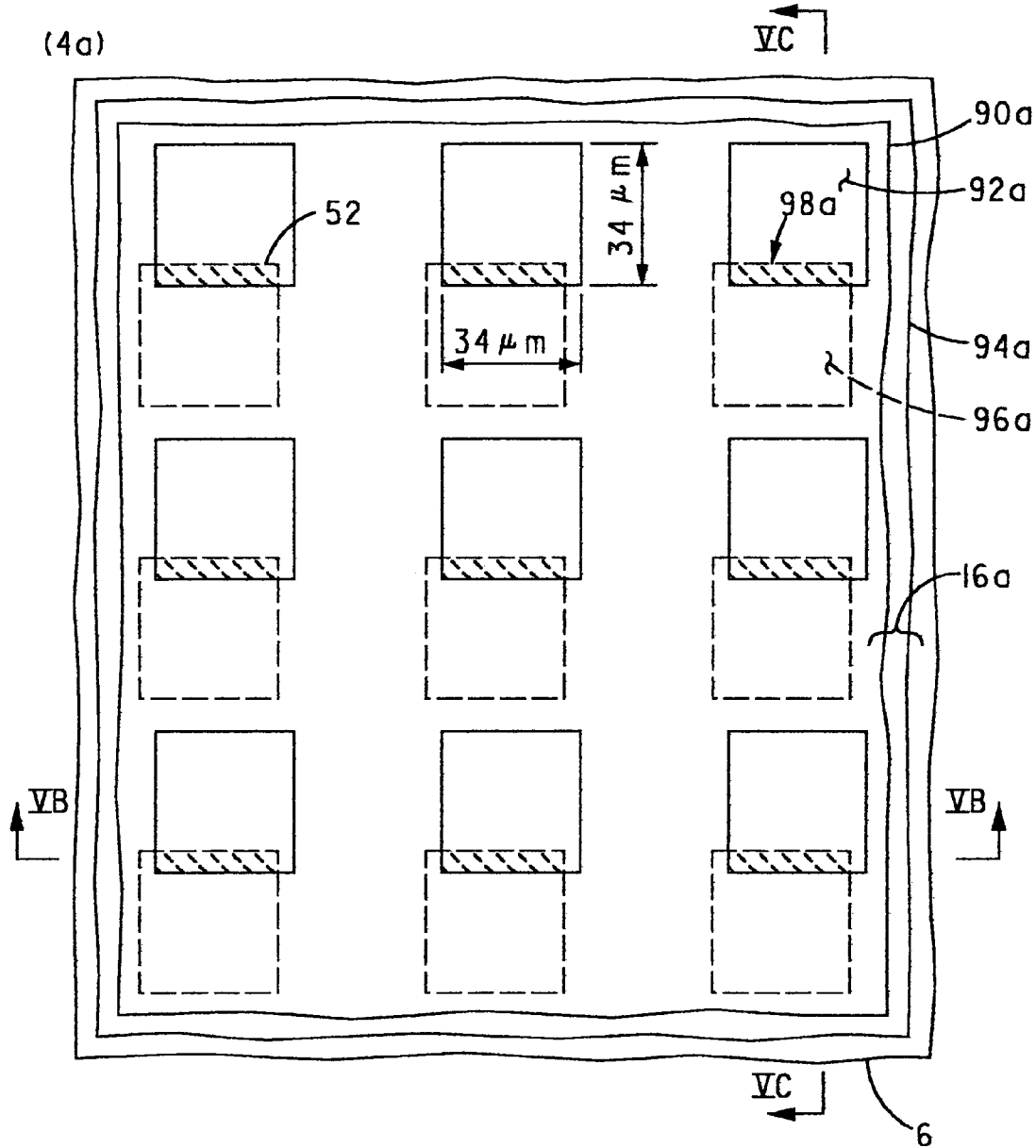
FIG. 5A is a view of a portion of a compound shadow mask utilized in the shadow mask deposition system of FIG. 1A atop a substrate upon which is deposited a plurality of segments of the sub-pixel structures shown in FIG. 4 through openings in the compound shadow mask.
Figure 5B:
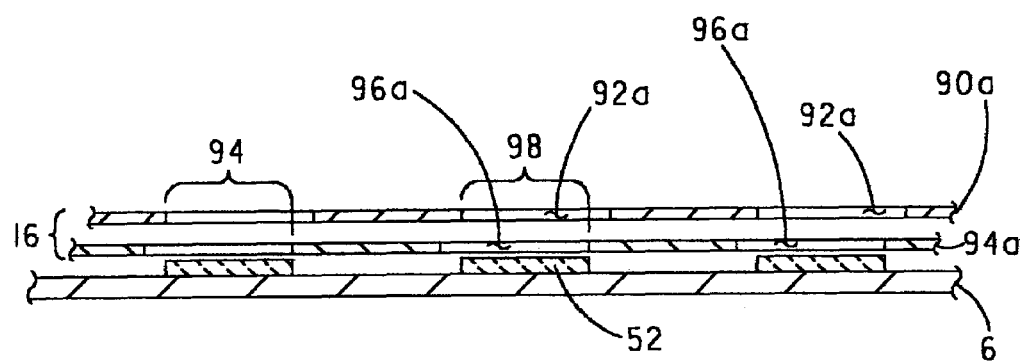
FIG. 5B is an exploded sectional view taken along lines VB-VB in FIG. 5A.
Figure 5C:
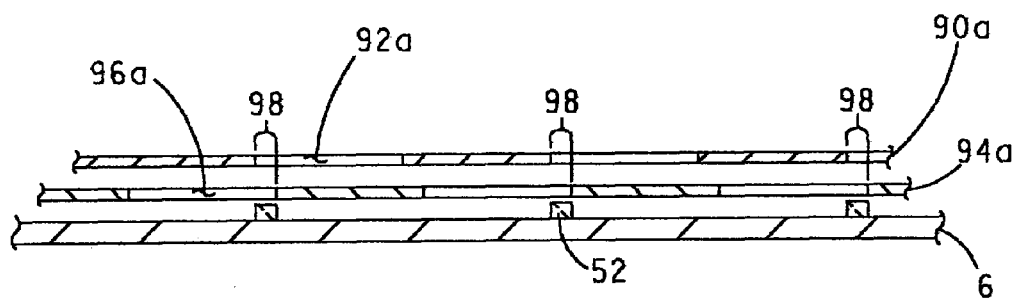
FIG. 5C is an exploded sectional view taken along lines VC-VC in FIG. 5A.

With reference to FIGS. 5A-5C and with continuing reference to all previous figures, each compound shadow mask 16 includes a first shadow mask 90 having a plurality of first apertures 92 therethrough and a second shadow mask 94 having a plurality of second apertures 96 therethrough. The description of first and second shadow masks 90 and 94 having a plurality of first apertures 92 and a plurality of second apertures 96 therethrough, respectively, is not to be construed as limiting the invention since first shadow mask 90 may only include a single first aperture 92 and second shadow mask 94 may only include a single second aperture 96 therethrough if desired. For purpose of describing the present invention, it will be assumed that first shadow mask 90 has a plurality of first apertures 92 therethrough and second shadow mask 94 has a plurality of second apertures 96 therethrough.

Each deposition vacuum vessel 4 desirably includes an instance of the same compound shadow mask 16. Thus, the compound shadow mask 16b in deposition vacuum vessel 4b is desirably the same as the compound shadow mask 16a in deposition vacuum vessel 4a; the compound shadow mask 16c in deposition vacuum vessel 4c is desirably the same as the compound shadow mask 16 in deposition vacuum vessel 4b; and so forth. More specifically, the first shadow masks 90 forming compound shadow masks 16 are desirably identical, the second shadow masks 94 forming compound shadow masks 16 are desirably identical, and each shadow mask 90 is desirably identical to each shadow mask 94. Thus, identical shadow masks 90a and 94a are desirably utilized to form compound shadow mask 16a; identical shadow masks 90b and 94b are desirably utilized to form compound shadow mask 16b, and so forth.

In order to accomplish the desired deposition of materials to form the various segments of each sub-pixel structure 50, the positions of first and second shadow masks 90 and 94 forming each compound shadow mask 16 are adjusted with respect to each other such that the respective first and second apertures 92 and 96 are positioned at least partially in alignment to define openings 98 of suitable dimensions or sizes and locations in compound shadow mask 16 for the deposition of material therethrough. Each compound shadow mask 16 can also be positioned within the corresponding deposition vacuum vessel 4 in a manner to position openings 98 to facilitate the deposition of the corresponding material at desired locations upon substrate 6.

It has been observed that in order to deposit each segment 52-80 of each sub-pixel structure 50 utilizing identical compound shadow masks 16 formed from identical shadow masks 90 and 94, that the height and width of each aperture 92 and 96 need be only slightly greater than one-half of the height and width of sub-pixel structure 50. Thus, for example, if the overall dimensions of sub-pixel structure 50 is 63×63 microns, it is only necessary that the overall dimensions of each aperture 92 and 96 be slightly greater than one-half of the dimensions of sub-pixel structure 50, e.g., 34×34 microns as shown in FIG. 5A.

Limiting the length and width of each aperture 92 and 96 to slightly more than one-half of the respective length and width of each sub-pixel structure 50 enables the shadow masks 90 and 94 comprising the compound shadow masks 16 of shadow mask deposition system 2 to deposit each segment 52-80 of each sub-pixel structure 50 while avoiding undesirable alignment of one or more instances of a single first apertures 92 with two or more second apertures 96, or vice versa. More specifically, the actual length and width of each aperture 92 and 96 is selected as a compromise between avoiding undesirable overlap of one or more instances of a single first apertures 92 with two or more second apertures 96, or vice versa, while, as shown best in FIG. 3, enabling desirable overlapping of deposited segments, e.g., segment 66 overlapping segment(s) 56; segment 76 overlapping segment(s) 74; segment(s) 64 overlapping segment 66, and so forth. In other words, limiting the length and width of each aperture 92 and 96 to slightly more than one-half of the length and width of the corresponding sub-pixel structure 50 enables the formation of a densely packed array of sub-pixel structures 50 by way of identical compound shadow masks 16, each of which is formed from identical shadow masks 90 and 94. An obvious benefit of utilizing identical shadow masks 90 and 94 to form each compound shadow mask 16 of shadow mask deposition system 2 is the avoidance of the time and cost associated with designing, fabricating and inventorying a unique shadow mask for each deposition vacuum vessel 4. Another benefit is the interchangeability of shadow masks 90 and 94 to form each compound shadow mask 16. This is especially beneficial when a new or clean shadow mask 90 or 94 is utilized to replace a worn-out or dirty (material encrusted) shadow mask.

FIGS. 5A-5C illustrate deposits of semiconductor segments 52 on a portion of substrate 6 via openings 98a formed by the partial alignments of first apertures 92a and second apertures 96a of shadow masks 90a and 94a, respectively, forming compound shadow mask 16a which is disposed in deposition vacuum vessel 4a having deposition source 12a for depositing the material forming semiconductor segments 52 on substrate 6. In FIGS. 5B and 5C, substrate 6, second shadow mask 94a and first shadow mask 90a are shown spaced from each other for illustration purposes. However, in practice, shadow mask 90a is positioned in intimate contact with shadow mask 94a which is positioned in intimate contact with substrate 6 during deposition of semiconductor segments 52. Moreover, in FIGS. 5B and 5C, the height of deposition of semiconductor segments 52 is exaggerated for illustration purposes.

The positioning of the first and second shadow masks 90 and 94 of each compound shadow mask 16 of shadow mask deposition system 2 for depositing material segments 54-80 will now be further described with reference to the alignment of a single first aperture 92 and a single second aperture 96 of first and second shadow masks 90 and 94, respectively, forming the corresponding compound shadow mask 16. In FIGS. 6-19, the alignment of the single first aperture 92 and the single second aperture 96 to form the opening 98 in the corresponding compound shadow mask 16 is shown adjacent an exemplary sub-pixel structure 50 for illustration purposes.

Figure 6:
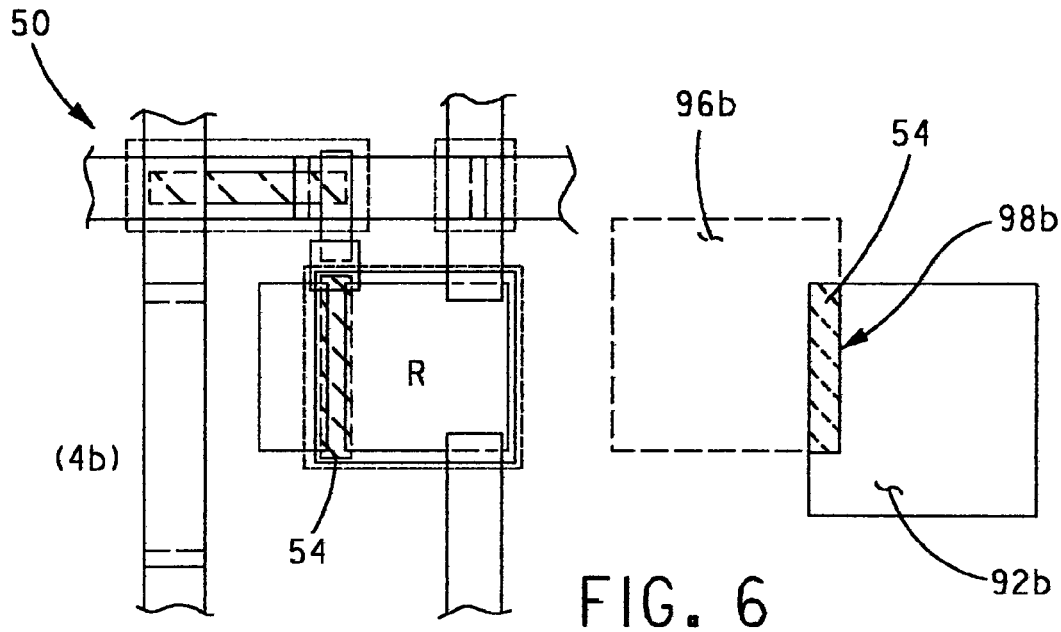
FIGS. 6-19 are views of a sequence of openings in compound shadow masks of the shadow mask deposition system of FIG. 1A through which a plurality of materials is deposited to form the sub-pixel element shown adjacent each opening.

With reference to FIG. 6 and with continuing reference to all previous figures, following the deposition of each semiconductor segment 52 on the portion of substrate 6 in deposition vacuum vessel 4a, said portion of substrate 6 is advanced into deposition vacuum vessel 4b which includes compound shadow mask 16b. The first and second shadow masks 90b and 94b of compound shadow mask 16b are positioned such that, for each sub-pixel structure 50, a single first aperture 92b and a single second aperture 96b are aligned to form an opening 98b of compound shadow mask 16b for the deposition of semiconductor segment 54 with material from deposition source 12b.

Figure 7:
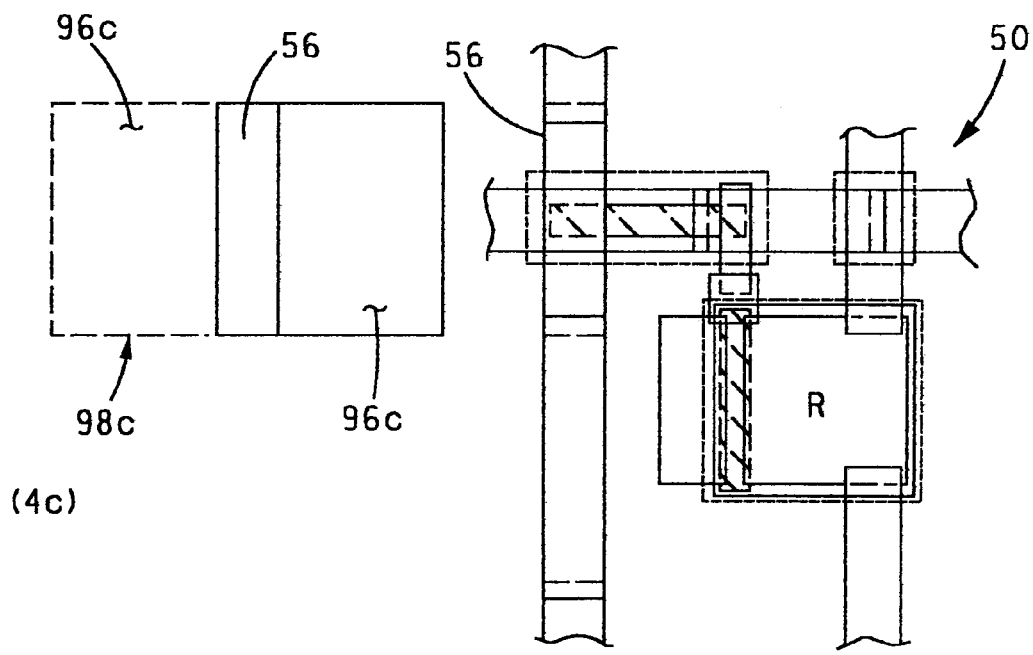

With reference to FIG. 7 and with continuing reference to all previous figures, following the deposition of each semiconductor segment 54 on the portion of substrate 6 in deposition vacuum vessel 4b, said portion of substrate 6 is advanced into deposition vacuum vessel 4c which includes compound shadow mask 16c. The first and second shadow masks 90c and 94c of compound shadow mask 16c are arranged such that, for each sub-pixel structure 50, a single first aperture 92c and a single second aperture 96c are aligned to form an opening 98c of compound shadow mask 16c for the deposition of metal segment 56 with material from deposition source 12c.

Figure 8:
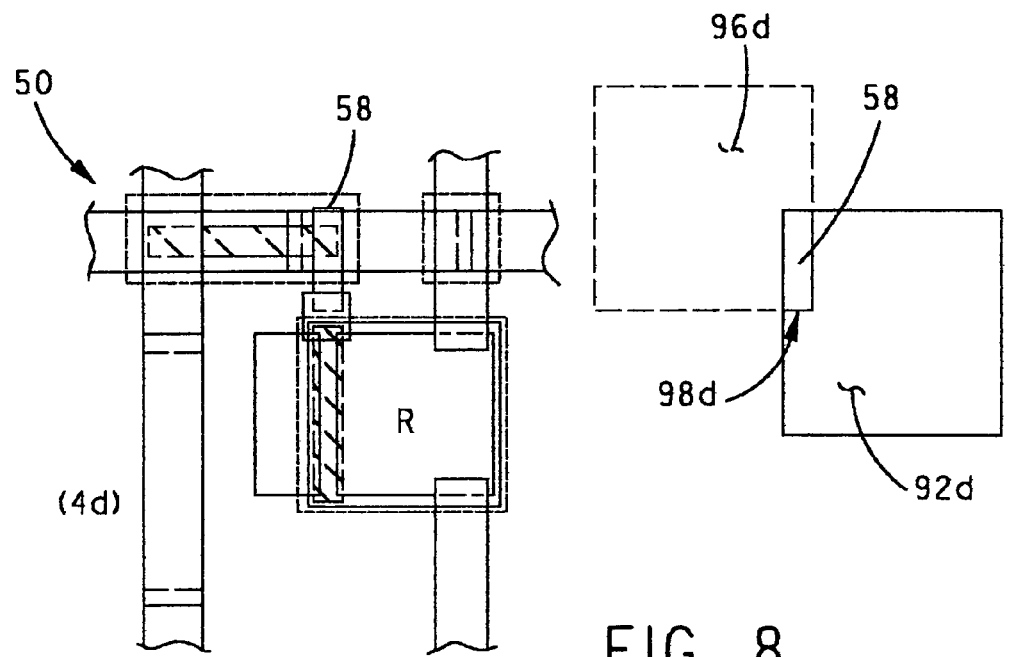

With reference to FIG. 8 and with reference to all previous figures, following the deposition of each metal segment 56 on the portion of substrate 6 in deposition vacuum vessel 4c, said portion of substrate 6 is advanced into deposition vacuum vessel 4d which includes compound shadow mask 16d. The first and second shadow masks 90d and 94d of compound shadow mask 16d are positioned such that, for each sub-pixel structure 50, a single first aperture 92d and a single second aperture 96d are aligned to form an opening 98d of compound shadow mask 16d for the deposition of metal segment 58 with material from deposition source 12d.

Figure 9:
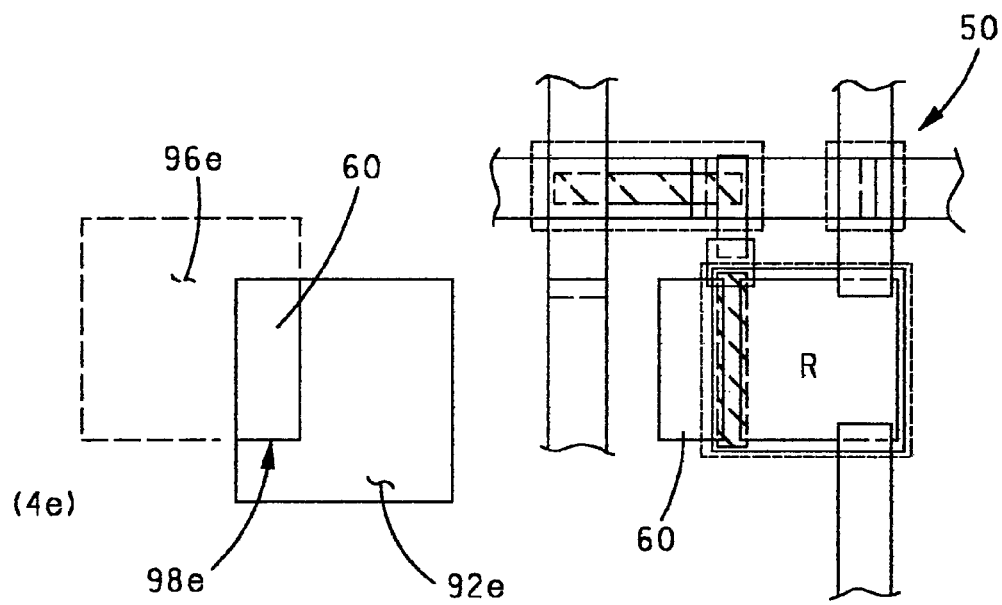

With reference to FIG. 9 and with continuing reference to all previous figures, following the deposition of each metal segment 58 on the portion of substrate 6 in deposition vacuum vessel 4d, said portion of substrate 6 is advanced into deposition vacuum vessel 4e which includes compound shadow mask 16e. The first and second shadow masks 90e and 94e of compound shadow mask 16e are positioned such that, for each sub-pixel structure 50, a single first aperture 92e and a single second aperture 96e are aligned to form an opening 98e of compound shadow mask 16c for the deposition of metal segment 60 with material from deposition source 12e.

Figure 10:
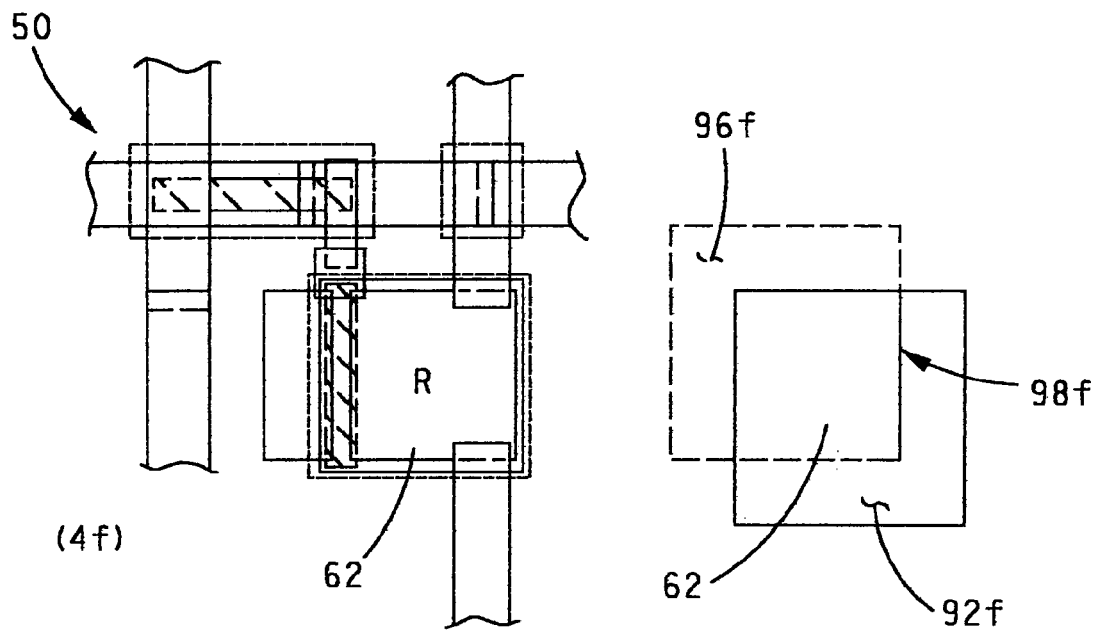

With reference to FIG. 10 and with continuing reference to all previous figures, following the deposition of each metal segment 60 on the portion of substrate 6 in deposition vacuum vessel 4e, said portion of substrate 6 is advanced into deposition vacuum vessel 4f which includes compound shadow mask 16f. The first and second shadow masks 90f and 94f of compound shadow mask 16f are positioned such that, for each sub-pixel structure 50, a single first aperture 92f and a single second aperture 96f are aligned to form an opening 98f of compound shadow mask 16f for the deposition of metal segment 62 with material from deposition source 12f.

Figure 11:
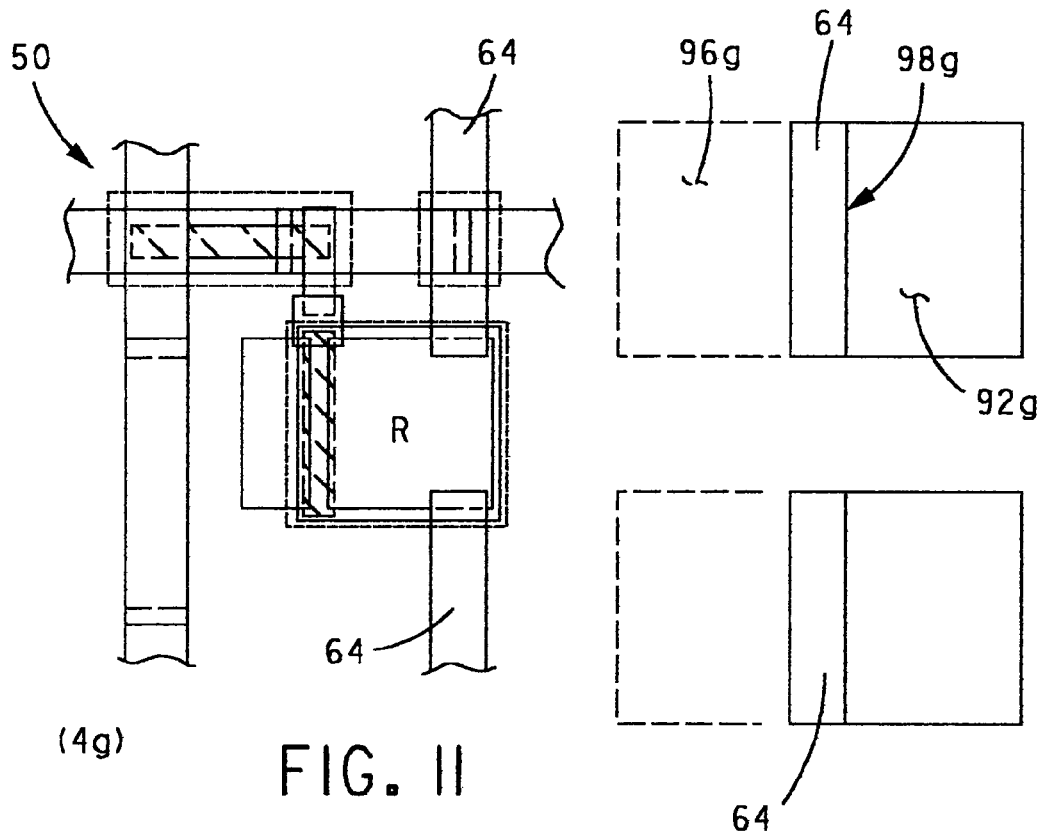

With reference to FIG. 11 and continuing reference to all previous figures, following the deposition of each metal segment 62 on the portion of substrate 6 in deposition vacuum vessel 4f, said portion of substrate 6 is advanced into deposition vacuum vessel 4g which includes compound shadow mask 16g. The first and second shadow masks 90g and 94g of compound shadow mask 16g are positioned such that a single first aperture 92g and a single second aperture 96g are aligned to form an opening 98g of compound shadow mask 16g for the deposition of each metal segment 64 with material from deposition source 12g.

Figure 12:
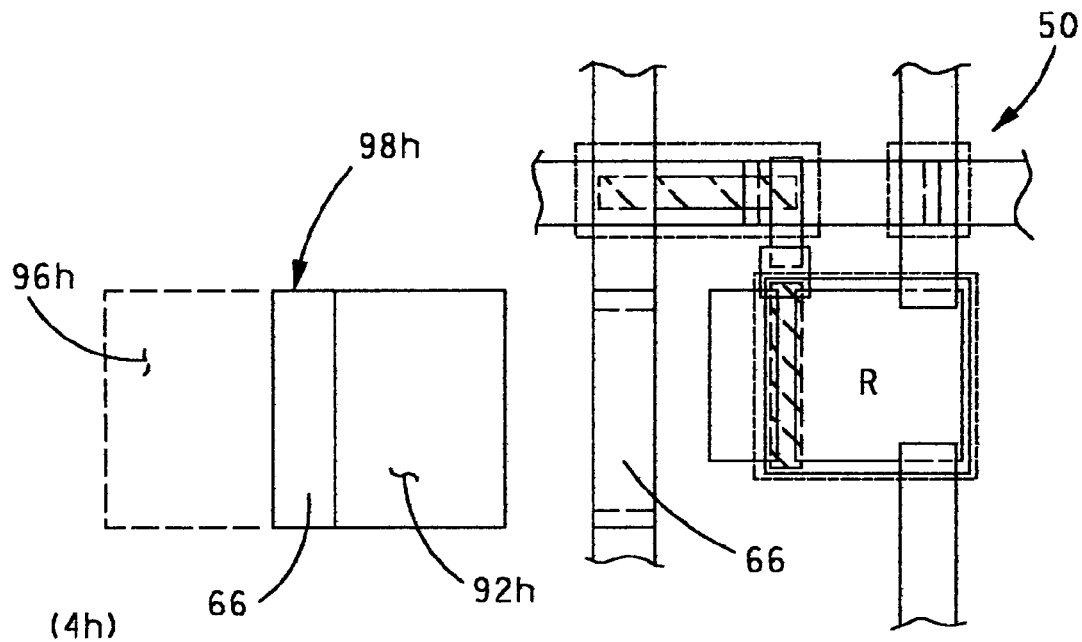

With reference to FIG. 12 and with continuing reference to all previous figures, following the deposition of each metal segment 64 on the portion of substrate 6 in deposition vacuum vessel 4g, said portion of substrate 6 is advanced into deposition vacuum vessel 4h which includes compound shadow mask 16h. The first and second shadow masks 90h and 94h of compound shadow mask 16h are positioned such that, for each sub-pixel structure 50, a single first aperture 92h and a single second aperture 96h are aligned to form an opening 98h of compound shadow mask 16h for the deposition of metal segment 66 with material from deposition source 12h.

Figure 13:
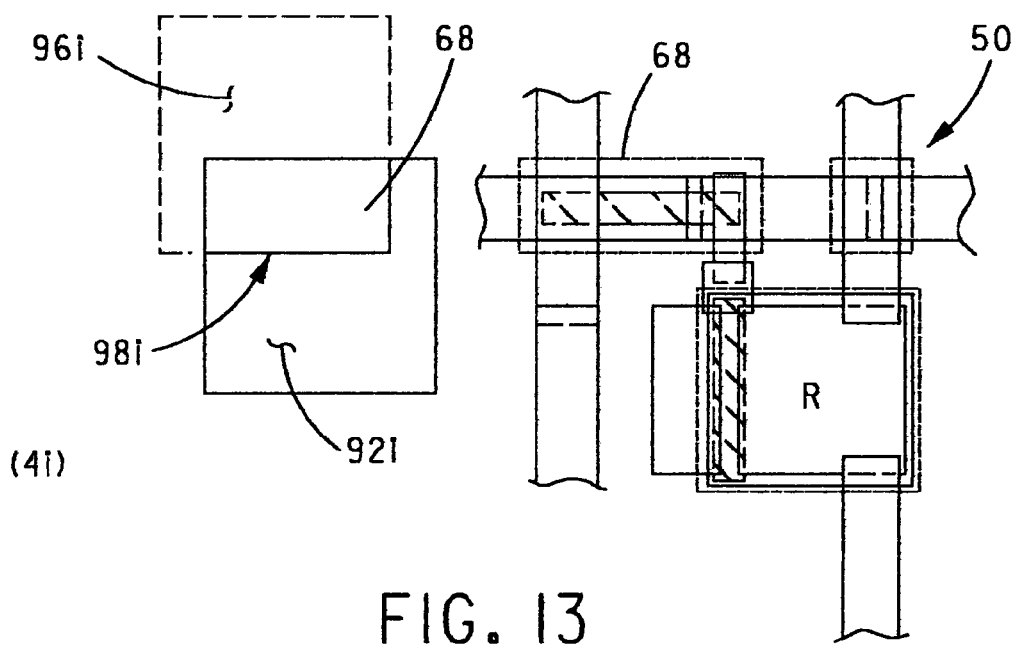

With reference to FIG. 13 and with continuing reference to all previous figures, following the deposition of each metal segment 66 on the portion of substrate 6 in deposition vacuum vessel 4h, said portion of substrate 6 is advanced into deposition vacuum vessel 4i which includes compound shadow mask 16i. The first and second shadow masks 90i and 94i of compound shadow mask 16i are positioned such that, for each sub-pixel structure 50, a single first aperture 92i and a single second aperture 96i are aligned to form an opening 98i of compound shadow mask 16i for the deposition of insulator segment 68 with material from deposition source 12i.

Figure 14:
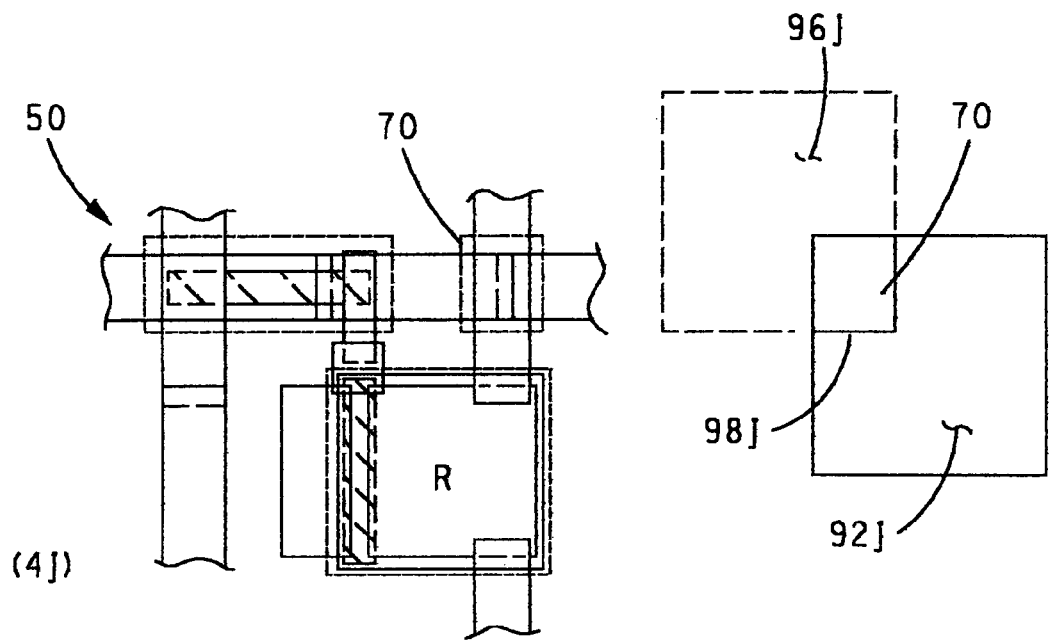

With reference to FIG. 14 and with continuing reference to all previous figures, following the deposition of each insulator segment 68 on the portion of substrate 6 in deposition vacuum vessel 4i, said portion of substrate 6 is advanced into deposition vacuum vessel 4j which includes compound shadow mask 16j. The first and second shadow masks 90j and 94j of compound shadow mask 16j are positioned such that, for each sub-pixel structure 50, a single first aperture 92j and a single second aperture 96j are aligned to form an opening 98j of compound shadow mask 16j for the deposition of insulator segment 70 with material from deposition source 12j.

Figure 15:
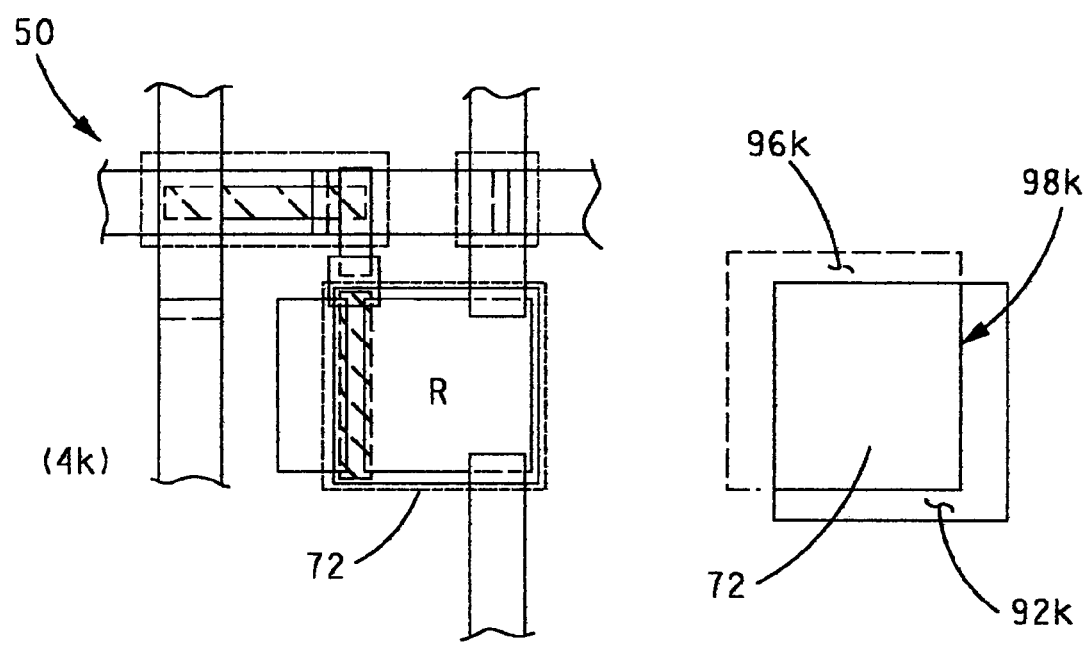

With reference to FIG. 15 and with continuing reference to all previous figures, following the deposition of each insulator segment 70 on the portion of substrate 6 in deposition vacuum vessel 4j, said portion of substrate 6 is advanced into deposition vacuum vessel 4k which includes compound shadow mask 16k. The first and second shadow masks 90k and 94k of compound shadow mask 16k are positioned such that, for each sub-pixel 50, a single first aperture 92k and a single second aperture 96k are aligned to form an opening 98k of compound shadow mask 16k for the deposition of insulator segment 72 with material from deposition source 12k.

Figure 16:
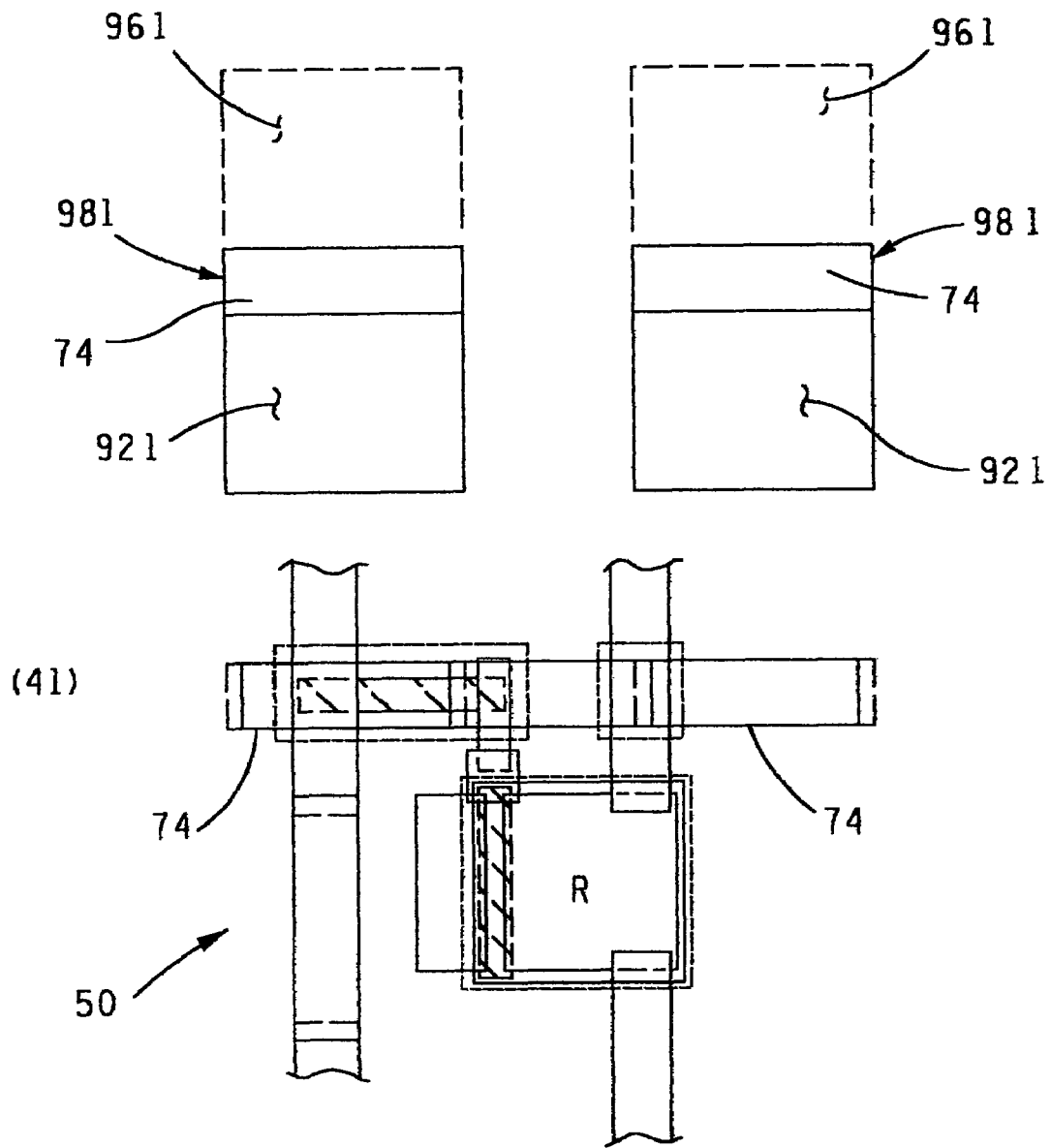

With reference to FIG. 16 and with continuing reference to all previous figures, following the deposition of each insulator segment 72 on the portion of substrate 6 in deposition vacuum vessel 4k, said portion of substrate 6 is advanced into deposition vacuum vessel 4l which includes compound shadow mask 16l. The first and second shadow masks 90l and 94l of compound shadow mask 16l are positioned such that a single first aperture 92l and a single second aperture 96l are aligned to form an opening 98l of compound shadow mask 16l for the deposition of each metal segment 74 with material from deposition source 12l.

Figure 17:
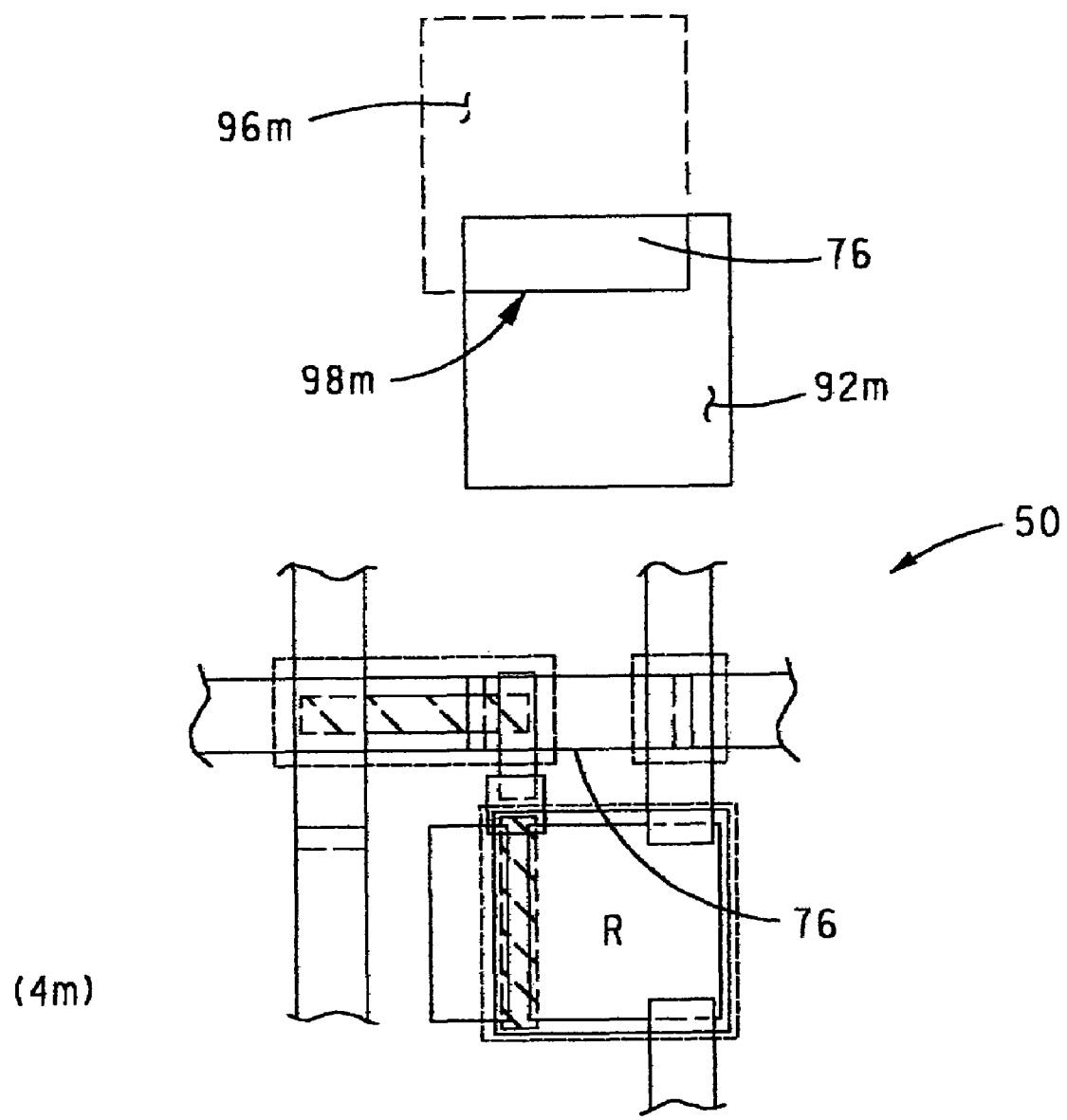

With reference to FIG. 17 and with continuing reference to all previous figures, following the deposition of each metal segment 74 on the portion of substrate 6 in deposition vacuum vessel 4l, said portion of substrate 6 is advanced into deposition vacuum vessel 4m which includes compound shadow mask 16m. The first and second shadow masks 90m and 94m of compound shadow masks 16m are positioned such that, for each sub-pixel structure 50, a single first aperture 92m and a single second aperture 96m are aligned to form an opening 98m of compound shadow mask 16m for the deposition of metal segment 76 with material from deposition source 12m.

Figure 18:
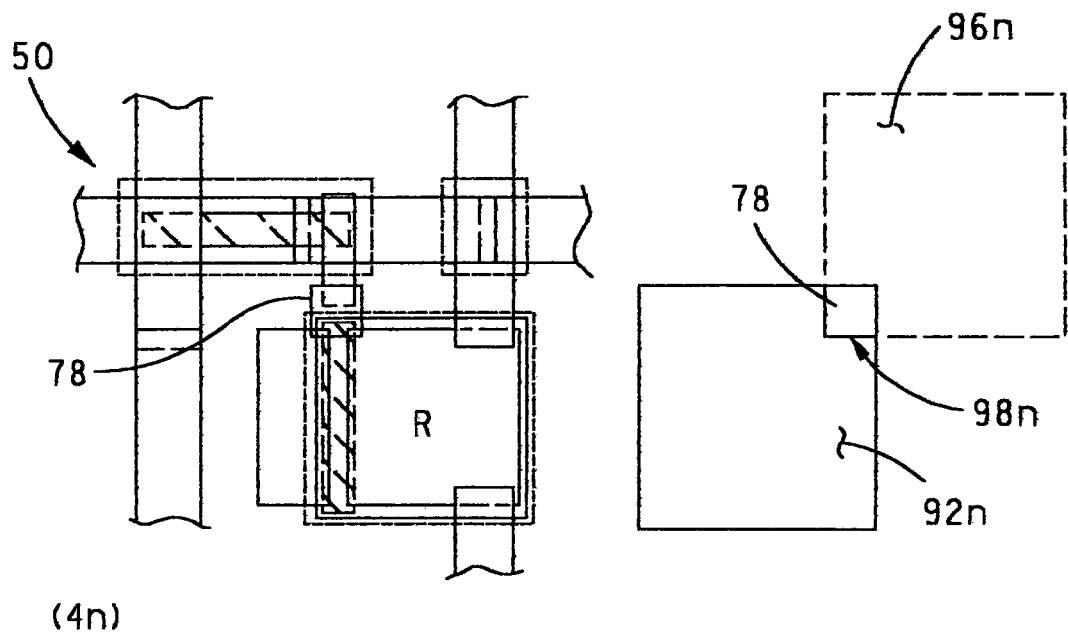

With reference to FIG. 18 and with continuing reference to all previous figures, following the deposition of each metal segment 76 on the portion of substrate 6 in deposition vacuum vessel 4m, said portion of substrate 6 is advanced into deposition vacuum vessel 4n which includes compound shadow mask 16n. The first and second shadow masks 90n and 94n of compound shadow mask 16n are positioned such that, for each sub-pixel structure 50, a single first aperture 92n and a single second aperture 96n are aligned to form an opening 98n of compound shadow mask 16n for the deposition of metal segment 78 with material from deposition source 12n.

Figure 19:
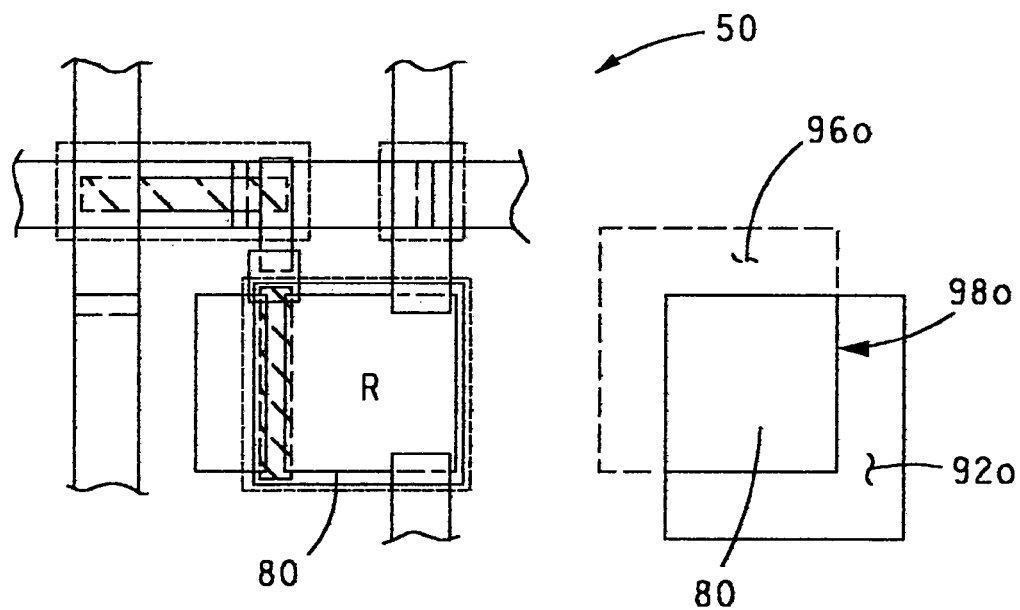

Lastly, with reference to FIG. 19 and with continuing reference to all previous figures, following the deposition of each metal segment 78 on the portion of substrate 6 in deposition vacuum vessel 4n, said portion of substrate 6 is advanced into deposition vacuum vessel 4o which includes compound shadow mask 16o. The first and second shadow masks 90o and 94o of compound shadow mask 16o are positioned such that, for each sub-pixel structure 50, a single first aperture 92o and a single second aperture 96o are aligned to form an opening 98o of compound shadow mask 16o for the deposition of metal segment 80 with material from deposition source 12o.

The deposition of metal segment 80 on substrate 6 completes the formation of the electronic element defined by sub-pixel structure 50. Desirably, all of the sub-pixel structures 50 are formed at the same time in the manner discussed above. Thereafter, if desired, additional segments or layers, described above, can be applied to substrate 6 in furtherance of the fabrication of an electronic device, such as an active matrix LED.

In the foregoing description, all of the shadow masks 90 are the same and all of the shadow masks 94 are the same. In addition, each shadow mask 90 is the same as each shadow mask 94. Limiting the size of each aperture 92 and 96 to a length and width slightly greater than about one-half of the length and width, respectively, of the sub-pixel structure to be formed thereby enables alignment combinations of apertures 92 and 96 to be utilized to form tightly packed structures, such as an array of sub-pixel structures 50, on substrate 6 while avoiding overlap of a single first aperture 92 with two or more second apertures 96, or vice versa, during a deposition event. The use of a plurality of identical shadow masks 90 and 94 to form the compound shadow masks 16 of shadow mask deposition system 2 avoids the need to engineer, manufacture and inventory a large number of different shadow masks having openings of different dimensions (or sizes) and/or locations for use in shadow mask deposition system 2.

Desirably, the mask alignment system 15 of each deposition vacuum vessel 4 is configured to enable the selective x and/or y alignment of one or both of each individual shadow mask 90 and 94 forming the corresponding compound shadow mask 16 from an exterior of the deposition vacuum vessel 4 whereupon the x and/or y dimension(s) of each opening 98 of the compound shadow mask 16 can be adjusted without breaking the vacuum of the deposition vacuum vessel 4. Thus, if it is determined that one or more dimensions of material deposited through each opening 98 of a compound shadow mask 16 is out of tolerance, mask alignment system 15 can be utilized to adjust said one or more dimensions without breaking the vacuum of the deposition vacuum vessel 4 to bring subsequent depositions of material into tolerance. The capacity provided by each mask alignment system 15 to adjust one or more dimensions of each opening 98 of a compound shadow mask 16 is particularly useful in a continuous in-line shadow mask deposition system to compensate for the buildup of deposited material on or around each opening 98 during a continuous production process thereby avoiding the need to break the vacuum of the deposition vacuum vessel 4 to adjust the dimensions of each opening 98 in response to such buildup. Each mask alignment system 15 is also useful for establishing the dimensions of each opening 98 and the position thereof in the corresponding deposition vacuum vessel 4 prior to the production deposition of material as well as for correcting for any changes in the dimensions of each opening 98 bought about by means other than the buildup of deposited material, e.g., vibration.

In one non-limiting embodiment, mask alignment system 15 comprises micrometers for adjustment of the x and/or y position of each individual shadow mask 90 and 94 forming the corresponding compound shadow mask 16. However, this is not to be construed as limiting the invention.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A shadow mask deposition method of forming an electronic device comprising:
    (a) providing a plurality of identical shadow masks arranged in a number of stacks to form a like number of compound shadow masks, each of which is disposed in a deposition vacuum vessel along with a material deposition source;
    (b) depositing a first material on a substrate from the material deposition source in a first deposition vacuum vessel via an opening in a first compound shadow mask formed by the whole or partial alignment of apertures of the stack of shadow masks forming said first compound shadow mask; and
    (c) depositing a second material on the substrate from the material deposition source in a second deposition vacuum vessel via an opening in a second compound shadow mask formed by the whole or partial alignment of apertures in the stack of the shadow masks forming said second compound shadow mask, wherein at least one of (i) dimensions of each compound shadow mask opening and (ii) a location of each compound shadow mask opening relative to the substrate during the deposition of material through said opening is different whereupon the dimensions and/or the location of each material deposited on the substrate is different.

2. The method of claim 1, further comprising sequentially depositing a plurality of materials on the substrate via openings in a like plurality of compound shadow masks to form an array of electronic elements on the substrate, wherein each opening is formed by the whole or partial alignment of apertures in the shadow masks forming said compound shadow mask.

3. The method of claim 2, wherein each material is one of a conductor, an insulator and a semiconductor.

4. A method of an electronic device comprising the steps of:
    (a) providing a substrate;
    (b) depositing semiconductor material on the substrate through a compound shadow mask in the presence of a vacuum;
    (c) depositing conductive material on the substrate through a compound shadow mask in the presence of vacuum; and
    (d) depositing insulating material on the substrate through a compound shadow mask in the presence of a vacuum, wherein:
    each compound shadow mask is comprised of a plurality of identical shadow masks, each of which has an aperture therethrough;
    the shadow masks of each compound shadow mask are positioned with the apertures thereof aligned in manner to define an opening through the compound shadow mask for the deposition of material in a desired pattern on the substrate therethrough; and
    the deposit of the insulating material, the semiconductor material and the conductive material co-act to from an electronic element on the substrate solely by the successive deposition of materials through the openings in the compound shadow masks.

5. The method as set forth in claim 4, wherein the element is a thin film transistor (TFT), a diode, a memory element or a capacitor.

6. The method as set forth in claim 4, wherein all of the compound shadow masks are the same.

* * * * *

UNITED STATES PATENT AND TRADEMARK OFFICE
CERTIFICATE OF CORRECTION

PATENT NO.         : 7,645,708 B2                                                Page 1 of 1
APPLICATION NO.    : 11/820406
DATED              : January 12, 2010
INVENTOR(S)        : Brody et al.

It is certified that error appears in the above-identified patent and that said Letters Patent is hereby corrected as shown below:

Column 14, Line 33, Claim 4, "of vacuum" should read -- of a vacuum --

Column 14, Line 52, Claim 5, "the element" should read -- the electronic element --

Signed and Sealed this

Fourth Day of May, 2010

David J. Kappos
*Director of the United States Patent and Trademark Office*